United States Patent [19]
Gilyard

[11] Patent Number: 5,908,176
[45] Date of Patent: Jun. 1, 1999

[54] IN-FLIGHT ADAPTIVE PERFORMANCE OPTIMIZATION (APO) CONTROL USING REDUNDANT CONTROL EFFECTORS OF AN AIRCRAFT

[75] Inventor: Glenn B. Gilyard, Palmdale, Calif.

[73] Assignee: The United States of America as represented by the Administrator of the National Aeronautics and Space Administration, Washington, D.C.

[21] Appl. No.: 08/783,639

[22] Filed: Jan. 14, 1997

[51] Int. Cl.$^6$ ................................................. B64C 13/18
[52] U.S. Cl. ..................... 244/203; 244/213; 244/219; 244/195; 244/130; 701/3
[58] Field of Search ..................... 244/203, 213, 244/215, 219, 76 R, 194, 195, 76 A, 221, 225, 90 R, 130; 701/3, 4, 8, 10, 11, 14

[56] References Cited

U.S. PATENT DOCUMENTS

| | | |
|---|---|---|
| 4,159,088 | 6/1979 | Cosley . |
| 4,326,253 | 4/1982 | Cooper et al. . |
| 4,485,446 | 11/1984 | Sassi . |
| 4,723,214 | 2/1988 | Frei . |
| 4,741,503 | 5/1988 | Anderson et al. ................ 244/203 |
| 4,797,829 | 1/1989 | Martorella et al. ............... 701/3 |
| 4,899,284 | 2/1990 | Lewis et al. ..................... 701/3 |
| 4,932,611 | 6/1990 | Horikawa ......................... 244/203 |
| 5,457,630 | 10/1995 | Palmer ............................ 701/3 |
| 5,457,634 | 10/1995 | Chakravarty ..................... 701/3 |
| 5,478,031 | 12/1995 | Piche .............................. 244/195 |

*Primary Examiner*—William Grant
*Attorney, Agent, or Firm*—John H. Kusmiss

[57] ABSTRACT

Practical application of real-time (or near real-time) Adaptive Performance Optimization (APO) is provided for a transport aircraft in steady climb, cruise, turn descent or other flight conditions based on measurements and calculations of incremental drag from a forced response maneuver of one or more redundant control effectors defined as those in excess of the minimum set of control effectors required to maintain the steady flight condition in progress. The method comprises the steps of applying excitation in a raised-cosine form over an interval of from 100 to 500 sec. at the rate of 1 to 10 sets/sec of excitation, and data for analysis is gathered in sets of measurements made during the excitation to calculate lift and drag coefficients $C_L$ and $C_D$ from two equations, one for each coefficient. A third equation is an expansion of $C_D$ as a function of parasitic drag, induced drag, Mach and altitude drag effects, and control effector drag, and assumes a quadratic variation of drag with positions $\delta_i$ of redundant control effectors i=1 to n. The third equation is then solved for $\delta_{i_{opt}}$ the optimal position of redundant control effector i, which is then used to set the control effector i for optimum performance during the remainder of said steady flight or until monitored flight conditions change by some predetermined amount as determined automatically or a predetermined minimum flight time has elapsed.

6 Claims, 7 Drawing Sheets

IN-FLIGHT ADAPTIVE PERFORMANCE OPTIMIZATION (APO) CONTROL USING REDUNDANT CONTROL EFFECTORS OF AN AIRCRAFT

ORIGIN OF INVENTION

The invention disclosed herein was made by an employee of the United States Government and may be manufactured and used by or for the Government for governmental purposes without the payment of any royalties thereon or therefor.

TECHNICAL FIELD

The invention relates to using any or all redundant control effectors of an aircraft (subsonic or supersonic transports and fighters) to optimize actual in-flight performance of any specific aircraft configuration (particularly transport aircraft) during various flight conditions of different mission segments and while experiencing changes in flight conditions. The term "redundant control effectors" is defined as any control surfaces, such as modulation and vectoring control systems and control systems that are in addition to the very minimum effectors (surfaces and systems) required to make any specific aircraft configuration capable of flight during any specific flight condition.

BACKGROUND OF THE INVENTION

Aircraft efficiency is a critical factor for airline profitability. A one percent performance improvement (1% fuel use reduction) for a fleet of transport aircraft can result in great savings, as much as approximately $100 million per year for the United States fleet of wide-body aircraft at current fuel costs (55 cents per gallon) and an additional $20 million per year for each ten cents per gallon increase in fuel price.

Development of a significant amount of transport efficiency technology that started in the 1970's and 1980's has continued into the 1990's. An aircraft energy efficiency (ACEE) program explored maneuver load control, elastic mode suppression, gust load alleviations (J. F. Johnson, "*Accelerated Development and Flight Evaluation of Active Controls Concepts for Subsonic Transport Aircraft—Volume I—Load Alleviation/Extended Span Development and Flight Tests,*" NASA CR-172277, 1984 ), relaxed static stability (W. A. Guinn, J. J. Rising and W. J. Davis, "*Development of an Advanced Pitch Active Control System for a Wide Body Jet Aircraft,*" NASA CR-172277, 1984) and reduced-area horizontal tail design (J. J. Rising, "*Development of a Reduced Area Horizontal Tail for a Wide Body Jet Aircraft,*" NASA CR-172278, 1984). An advanced F-111 fighter technology integration Mission Adaptive Wing (MAW) program developed and demonstrated variable-camber control for optimization of cruise and maneuver flight conditions ("*Advanced Fighter Technology Integration F-111 Mission Adaptive Wing* (ITAR), NASA CP-3055, 1990; E. L. Friend, "*Flight Buffet Characteristics of a Smooth Variable-Camber Mission Adaptive Wing for Selected Wing Flap Deflections* (ITAR), NASA TM-4455, 1993).

A member of the Airbus Industries team performed preliminary design work and wind-tunnel testing for implementing variable camber as a redundant effector in the A330/A340 aircraft. Benefits of variable camber include improved aerodynamic efficiency through improved lift-to-drag ratio (L/D), increased Mach number (M) capability, improved buffet boundary, increased operational flexibility, reduced structural weight and reduced fuel burn. Variable camber has also increased aircraft development potential. However, the proposed use of a variable camber design as a redundant effector did not include development of a real-time adaptive performance optimization methodology.

J. J. Spillman has provided an excellent dissertation relative to the fundamentals of variable camber as applied to transports ("The Use of Variable Camber to Reduce Drag, Weight and Costs of Transport Aircraft," *Aeronautical Journal*, Vol. 96, January 1992, pp. 1–9).

American manufacturers have also been actively involved in efficiency enhancement and have explored and implemented fixed-point rerigging of redundant control effectors to minimize airframe drag ("Long Live the Leviathan," *Flight International*, Sep. 15–21, 1993, pp. 30–31 and Guy Norris, "New MD-11 Update Revealed," *Flight International*, Dec. 21, 1994–Jan. 3, 1995, page 9).

The literature is replete with reports documenting trajectory optimization algorithms and their benefits relative to the economics of commercial transports. In fact, all large transports currently being produced have computer-based Flight Management Systems (FMS) that optimize the aircraft trajectory to minimize cost as a function of flight time and fuel price. However, the common basis for these algorithms are models of performance-related aspects of the particular aircraft model under specific flight conditions. As a result, the optimal trajectory is only as good as the onboard FMS models. In addition to the baseline onboard model having less than perfect accuracy, airframe and propulsion system degradation are factors which affect model accuracy.

NASA's Dryden Flight Research Center (DFRC), at Edwards, Air Force Base, California is active in transitioning performance improvement technology to transport aircraft (Glenn B. Gilyard and Martin D. Espana, "*On the Use of Controls for Subsonic Transport Performance Improvement: Overview and Future Directions,*" NASA TM-4605, 1994). Realizable performance benefits are smaller for transport aircraft than for high performance fighter aircraft. The designs of most transports have already been highly refined for good performance under a steady-state cruise flight condition. An algorithm developed on a Performance-Seeking Control (PSC) program was useful as an early demonstration of the benefits to be accrued on performance aircraft with detailed models available, though not suitable for implementing further performance optimization on transports primarily because of the fact that the algorithm was heavily based on a priori model data and absolute measurement accuracy (Glenn B. Gilyard and John S. Orme, "*Performance Seeking Control: Program Overview and Future Directions,*" NASA TM-4531, 1993). Consequently, DFRC is exploring the application of measurement-based APO for performance improvement on transports using redundant control effectors.

Adaptive Control Background

Application of adaptive control to aircraft has been ongoing for more than 30 years with varying degrees of success. These applications have often centered on handling quality-related control system improvements, which often involve optimizing a very subjective, often ill-defined criteria typically involving handling qualities, for example, pilot ratings. Because of the subjective nature of handling qualities, adaptive control techniques are not necessarily well-suited approaches to the problem. Also note that in many flight control applications, use of adaptive techniques has led to safety concerns about gain and phase margin reductions. Such reductions have contributed to stability and control problems.

As such, adaptive control, as applied to flight control, has not found wide acceptance within the aerospace community.

Lack of interest in adaptive control is partially caused by the satisfactory results that have been obtained using conventional design techniques and by lack of an overriding reason to obtain similar results by using more complex techniques.

Application of adaptive control is particularly advantageous when the optimization objective is well defined and there are significant unknowns about the aircraft and its operation. Application of adaptive optimal control to quasi-steady performance optimization has clear benefits that are not achievable in control design processes that are tailored to handling qualities issues. Quasi-steady performance optimization has well-defined objectives (i.e., minimize drag). For this reason, adaptive optimal control is well-suited to performance optimization. In addition, application of adaptive optimal control, using a measured performance metric, is insensitive to modeling inaccuracies and measurement biases. Because low frequency constrained maneuvers are proposed, stability- and control-related safety issues and affects on ride qualities are greatly minimized.

Regarding work of the Airbus Industrie team and Americans involved in exploring variable-camber performance optimization, neither side has devoted serious attention to a real-time Adaptive Performance Optimization (APO) algorithm. The Americans used either predetermined deflection schedules or a real-time, trial-and-error approach for camber control (*Advanced Fighter Technology Integration F-111 Mission Adaptive Wing* (ITAR), NASA CP-3055, 1990, and P. W. Phillips, and S. b. Smith, *AFTI/F-111 Mission Adaptive Wing (MAW) Automatic Flight Control System Modes Lift and Drag Characteristics*, AFFTC-TR-89-03, May 1989). In the case of the Airbus Industrie team, only model-based or experimentally determined scheduling was briefly mentioned as a means of camber control (J. Szodruch and R. Hilbig, "Variable Wing Camber for Transport Aircraft," *Progress in Aerospace Sciences*, Vol. 25. No. 3, 1988, pp. 297–328).

Application of adaptive optimal techniques to performance optimization does not require accurate models or absolute measurements. The adaptive optimal approach is based on real-time estimation of gradients of performance measures to control variables. These gradients are based on flight measurements and not based on predictions, except as noted herein below. In addition, because gradients are used, the approach is insensitive to measurement biases.

An adaptive optimal approach is ideally suited for use on operational "fleet" aircraft where there is uncertainty in the aircraft model and absolute measurement accuracy. Likewise, adaptive performance techniques have a valuable role for commercial aircraft where small benefits over a 20–30 yr service life can produce significant cost savings.

Many issues enter into the performance optimization problem for subsonic transport aircraft. Foremost, there must be the potential for optimization, which implies redundant control effector capability (i.e., more than one means of trimming out the forces and moments to maintain a steady-state flight condition). Most aircraft have significant capability in this area although taking advantage of this capability is a different issue. Performing optimization from a condition that is already fine-tuned (based on wind tunnel and flight testing) places increased demands on high-quality instrumentation to sense small differences in an unsteady environment.

APO compensates for all unique characteristics of the aircraft flight control system by continuously feeding back measurements of parameters that reflect the optimization objective, such as fuel flow (minimize) or velocity (maximize). A specific example is the use of symmetric aileron deflection in an algorithm applied to optimally recamber the wing for all aircraft configurations and flight conditions to optimize (maximize) lift-to-(drag ratio which can in turn be utilized to produce: minimum fuel flow, maximum Mach number, maximum altitude or maximum loiter time.

A feasibility study by Glenn Gilyard explored a prototype adaptive control law on a high-fidelity, nonlinear simulation of a first-generation wide-body jet aircraft that optimized wing-aileron camber for minimum aircraft drag at a given flight condition ("*Development of a Real-Time Transport Performance Optimization Methodology*," NASA TM-4730, 1996). This technology applies tc selected current generation aircraft and could be a requirement for future designs, such as proposed new large aircraft.

Challenge for Present and Future Aircraft

The APO of the present invention could play an important role in improving economic factors for the operation of aircraft. The challenge to in-flight performance optimization for subsonic and supersonic transport aircraft and fighters is the identification and minimization of very low levels of incremental drag. This is the key technological challenge because in order to provide an effective performance optimization algorithm, identification of incremental drag levels of one percent or less are required.

STATEMENT OF THE INVENTION

The present invention addresses the practical application of real time (or near real time) in-flight Adaptive Performance Optimization (APO) using a multiengine transport as an example and concentrates on onboard measurement and calculation of incremental drag from forced response maneuvers of redundant control effectors.

The method is based on using an Inertial Navigation System (INS) which may include blending with Global Positioning System (GPS) information that can produce very accurate linear and angular displacement, velocity and acceleration measurements. Along with other more conventional measurements, such as true airspeed available from an Air Data Computer (ADC), some of this INS and GPS information is used to calculate winds and angle of attack, $\alpha$. Thrust, $T_i$, is estimated from a prepared map in the form of a table made from a representative engine as a function of M, $P_s$ and $EPR_i$ where, M is Mach number obtained from the ADC, $P_s$ is static pressure obtained from the ADC, and EPR is engine pressure ratio obtained from engine measurement. In other words, thrust is estimated from a representative engine model as a function of calculated variables (M,P) and engine measurement values of EPR. While a thrust map may not be particularly accurate in absolute terms, it is typically very accurate in relative terms, i.e., it accurately reflects small changes about the trim (nominal) throttle position.

The following lift and drag equations are then used to calculate lift and drag coefficients, $C_L$ and $C_D$:

$$C_L = \text{Lift}/(qS) = \{WA_{zf_p} - \Sigma T_i \sin(\alpha - \eta)\}/(qS) \quad (1)$$

$$C_D = \text{Drag}/(qS) = \{\Sigma T_i \cos(\alpha - \eta) - WA_{xf_p}\}/(qS) \quad (2)$$

where: $q = M^2 P_s$ dynamic pressure, lb/ft² from ADC,

S = wing aircraft reference area, ft², known constant, $\alpha$ = angle of attack, radians, from aircraft measurement or calculation, W = aircraft gross weight, is calculated based on takeoff weight and fuel flow, $A_{zf_p}$ = acceleration normal to flight path, g, (positive upward g's) from INS, $A_{xf_p}$=acceleration along the flight path (positive forward g's) from INS, η=inclination ( known constant) of engine thrust relative to aircraft fuselage, radians and Σ=summation of the bracketed quantity over the number of engines of the aircraft from i=1 to N. Thrust related ram effects are assumed aligned with the gross thrust axis and are included in the other terms.

Next calculate the following unknown variables: $C_D$.

$$C_{Do}, K_o, C_{LminC_D} C_{D_M} + C_{D_{H_p}}, K_i\text{'s and } \delta_{iopt}\text{'s}$$

in the following equation $$C_D = \qquad (3)$$
$$C_{Do} + K_o\{C_L - C_{LminC_D}\}^2 + C_{D_M}\Delta M + C_{D_{H_p}}\Delta H_p + \Sigma K_i(\delta_i - \delta_{iopt})^2$$

where $CD_{Do}$=minimum drag coefficient, $C_{LminC_D}=C_L$ at minimum CD, $C_{D_M}$=coefficient of drag caused by Mach number, $C_{D_{H_p}}$ = coefficient of drag caused by altitude, ΔM=change in Mach number from the time of turning on the APO, $\Delta H_p$=Hp change in altitude from the time of turning the APO on, $K_o$ and $K_i$ are drag equation coefficients, $\delta_i$=position of a redundant control effector i, where i is an integer from 1,2 . . . n, $\delta_{iopt}$=optimal position of redundant control effector i, Σ=summation over the number n of redundant control effectors in use from i=1 to n.

Equation (3) is a mathematical expression for $C_D$ that is a function of aircraft parasitic drag, induced drag, Mach and altitude drag effects, and aileron drag. That equation assumes a quadratic variation of $C_D$ with $\delta_i$, and $\delta_i$ can include one or more redundant control effectors of the aircraft, such as symmetric ailerons, flaps, slats, spoilers, stabilizer, elevator, thrust, center-of-gravity and thrust vectoring, and propulsion system geometry and controls for longitudinal effectors and rudder, ailerons (normal or differential) and differential thrust lateral or directional effectors, so long as the designated effectors satisfy the definition of a redundant control effector for the condition of the specific flight segment to be optimized, such as but not limited to ascent, cruise, and descent.

If tables for estimating thrust as a function of EPR are not available, equations (1) and (2) can be expanded as follows:

$T=T_o+K_T(EPR)$ @Mach & altitude≈constant $T_o$=to be identified $K_T=\partial(T)/\partial(EPR)$=constant to be identified $C_L$=Lift/$(qS)$={$(W)A_{zf_p}-\Sigma(T_o+K_T(EPR))$ sin $(\alpha-\eta)$}/$(qS)$ $C_D$=Drag/$(qS)$={$\Sigma(T_o+K_T(EPR))$ cos $(\alpha-\eta)-(W)A_{xf_p}$}/$(qS)$ $C_L$ and $C_D$ are now algebraic expressions which are included in the expansion of the expression for $C_D$ in equation (3) as follows:

$$\{\Sigma(T_o + K_T(EPR))\cos(\alpha-\eta) - (W)A_{xf_p}\}/(qS) =$$
$$C_{Do} + K_o\{\{(W)A_{zf_p} - \Sigma(T_o + K_T(EPR))\sin(\alpha-\eta)\}/(qS) - C_{LminC_D}\}^2 +$$
$$C_{D_M}\Delta M + C_{D_{H_p}}\Delta H_p + \Sigma K_i(\delta_i - \delta_{iopt})^2$$

If the engines behave similarly, only two additional unknowns ($T_o$ and $K_T$) are added to the solution. To the degree engines behave differently, additional pairs of $T_o$ and $K_T$ are added as unknowns to the solution.

If a priori values of $K_o$ and $C_{LminC_D}$ are available, they can be utilized to reduce the number of unknowns to be determined. The algorithm may run either continuously in search of any change of optimal effector position $\delta_{iopt}$ or until a criteria has been met to assure optimal flight conditions have been reached (e.g., the optimal control position remains constant) and a new sequence of iterations may be called only at times when a criteria of change in any one or more flight variables has been met selected from a group comprising incremental change in speed, altitude, or elapsed time. The flight crew may also call for a new sequence of iterations at any time, but should not do so unless there is some clear indication, such as from the instrument panel, that an optimal flight condition has changed perceptibly. Otherwise, since the forced response of the redundant effectors may themselves induce drag while the optimum $\delta_{iopt}$ is being sought, it is best for the crew not to make a judgement except where it is clear a deviation from the optimum has occurred. In any case, the forced-response maneuvers should be small with a raised-cosine excitation form of 100 to 500 seconds to collect 100 to 500 or so sets of data at one set or so per second over the total excitation time at a rate of one to ten sets per second or so. (The rate can range from 1 to 10 sets per second.) This form for the excitation so satisfies the smoothness criteria as to be imperceptible to flight crew and passengers and allows for collecting a sufficiently high number of data sets required for the accuracy of optimization estimates desired.

The novel features that are considered characteristic of this invention are set forth with particularity in the appended claims. The invention will best be understood from the following description when read in connection with the accompanying drawings.

DETAILED DESCRIPTION OF THE INVENTION

Figure 1A:
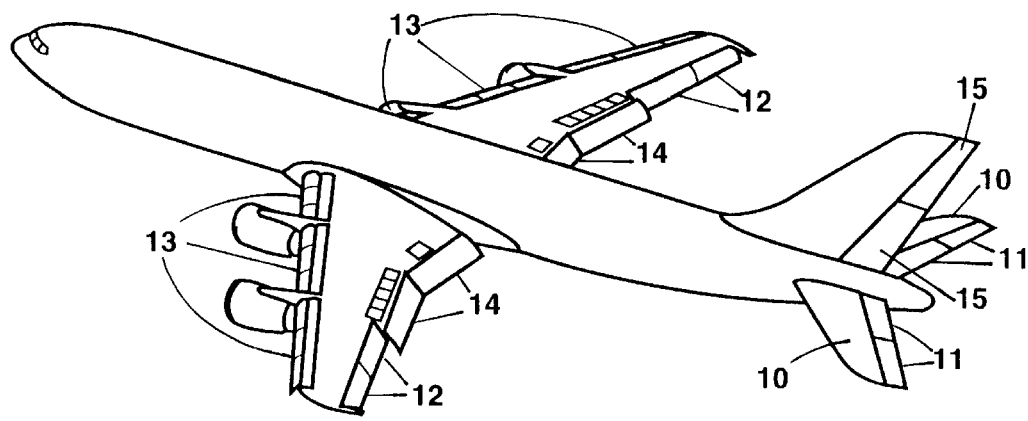
FIG. 1a illustrates a multiengine wide-body aircraft having many control effectors, a number n of which may be employed as redundant control effectors as the term is defined, depending upon what flight condition in steady state has been established.

An optimal control effector combination can only be determined when there is an excess of control effectors defined hereinbefore as redundant control effectors $\delta_i$ where i is an integer from 1 to n corresponding to how many of the excess effectors are to be used in the APO methodology for a particular flight condition. For most aircraft at a level cruise condition, there are usually only two control effectors with no excess. For example, in a multiengine aircraft shown in FIG 1a, level flight at constant Mach and altitude (assuming the aircraft is trimmed up in the lateral and directional axes) requires only two control effectors, typically thrust, T, (the throttle, not shown) and horizontal stabilizer 10. The throttle is used to counter balance the drag so that a given level of energy is maintained and the stabilizer 10 controls the balance between kinetic and potential energy.

The unique combination of throttle and horizontal stabilizer required to produce straight and level flight at constant Mach and altitude also results in a unique angle of attack, $\alpha_i$. Many aircraft have elevators 11 but they are a minor force and moment generator relative to the horizontal stabilizer 10. In many instances the elevators are coupled to the horizontal stabilizer motion. As such, the elevators are not an independent control effector. In such cases, the term stabilator refers to one control effector, namely the combination of effectors 10 and 11. Other effectors shown are slats 13, flaps 14, and rudder 15.

Assuming that there is an additional control effector (more than the required two discussed above) that can provide forces and moments in the aircraft's longitudinal and pitch axes, the additional control effector is referred to as a redundant control effector since it can provide forces and moments similar to those of the throttle and horizontal stabilizer. For the sake of discussion, assume this redundant control effector comprises symmetric outboard ailerons 12 on each wing which can be used to produce a change in wing camber and thus a wide range of wing aerodynamics.

With this one redundant control effector, there are now a virtually infinite number of combinations (at least mathematically speaking) of settings (positions) of the throttle, horizontal stabilizer, and symmetric ailerons which can produce a trimmed flight condition (level flight at constant Mach and altitude), each combination having a unique angle of attack. However, each of these combinations is not equally good in the sense of providing minimum aircraft drag. Even though there can theoretically be multiple drag minima, it is more likely that there is only one pronounced minima over a range of small changes in the combinations which can produce a minimum drag configuration. A method for finding this one unique combination of redundant control effectors and resulting angle of attack $\alpha$ that the present invention addresses, namely an Adaptive Performance Optimization (APO) algorithm using at least one redundant control effector while in a steady flight condition, such as a climb, cruise or descent condition.

Of course instead of there being only one additional redundant control effector there can be many, in which case a minimum drag for each may be sought by separate sequential excitations, each in accordance with the methodology of this invention described herein with reference to equations (1), (2) and (3), but the set of minima, although good in the sense of providing a better "minimum" drag than without the methodology, would not guarantee a true optimal configuration. It would be preferable to integrate the excitations (forced response of redundant effectors) in the methodology using combinations of small perturbations affected simultaneously as stated in equation (3).

The following describes the general sequence of events to obtain the optimal control effector combination, but first it should be noted that since the performance optimization method described is best suited to steady flight, the following autopilot and navigation modes should be engaged: altitude-hold, Mach- (or velocity-) hold, and heading-hold. In the event that the aircraft is not equipped for any of these modes, the pilot must perform the functions necessary for steady flight as best he can, although the latter case could result in less than true optimal $\delta_{i_{opt}}$ being determined due to degraded quality in the forced response maneuver and analysis of the redundant control effector(s) resulting from less than perfect steady flight. The methodology will now be described.

FIRST

Figure 1B:
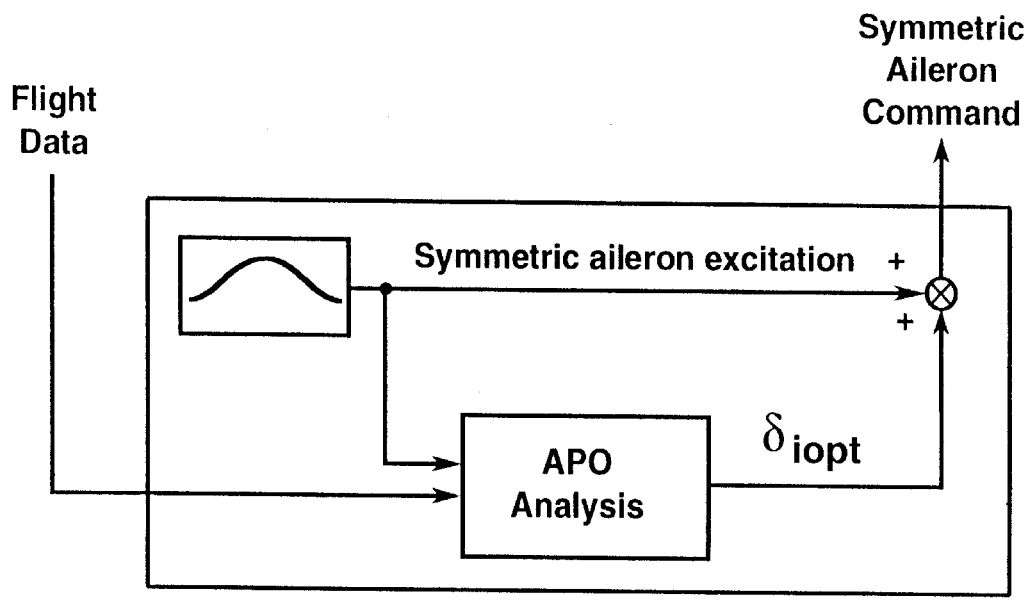
FIG. 1b illustrates how the Adaptive Performance Optimization (APO) feature of this invention is functionally applied to one redundant effector in one example.

Forced response excitation must be provided for each of the redundant control effectors, i=1,2 . . . n. In the case of only one redundant control effector i=1, as in the example of the symmetric outboard ailerons 12 used as one redundant effector discussed above with reference to FIG. 1a, that effector must be excited (moved to a new position) using the smooth raised-cosine excitation form shown in FIG. 2 and in FIG. 1b sufficiently for the resulting aircraft and control surface motion to provide sets of information (typically 100 to 500 sets at the rate of one to ten sets per second for raised-cosine excitation of a time interval (period) equal to 100 to 500 sec. from which the optimal position $\delta_{i_{opt}}$ is to be determined.

Figure 2:
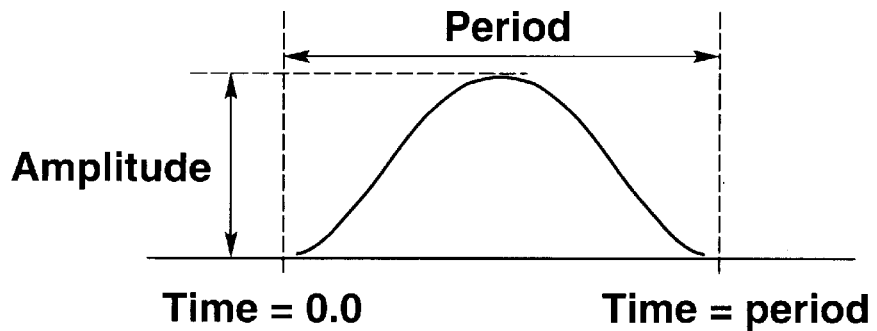
FIG. 2 illustrates a raised-cosine excitation form preferred to be used for forced-response maneuvers of selected redundant control effectors in the APO methodology of the present invention.

A passenger ride quality constraint is that the motions resulting from the forced response excitation be imperceptible (less than~0.02 g) to the average passenger. This requires both a smooth and slow excitation such that the autopilot (or pilot) can respond to the excitation in an effort to control a steady altitude, Mach (velocity) and heading. The raised-cosine excitation form of FIG. 2 satisfies the smoothness requirements for excitation periods (intervals) of 100 to 500 seconds. An interval in that range should allow for ride quality constraints to be satisfied while collecting data sets required by the methodology of equations (1), (2) and (3) at rates of from one to ten sets per second. The raised-cosine excitation function of FIG. 2 is defined by the following equation:

$$\delta_i = (A)\{1.0 - \cos(\{2\pi/P\}\text{TIME})\}/2 \quad (4)$$

where: A=maximum amplitude of the forced response (+or−) maneuver,

P=period (duration) of the maneuver,

TIME=starts at 0 and runs until the end of the period is reached,

π=3.141592654

Other excitation forms may, of course, be used to effectively obtain the optimal solution through analysis of all of the sets of data. However, the smooth raised-cosine form insures the smoothness that is required for passenger aircraft applications and for all other aircraft as well. Thus, depending on the application, other excitation forms may be used.

Figure 3:
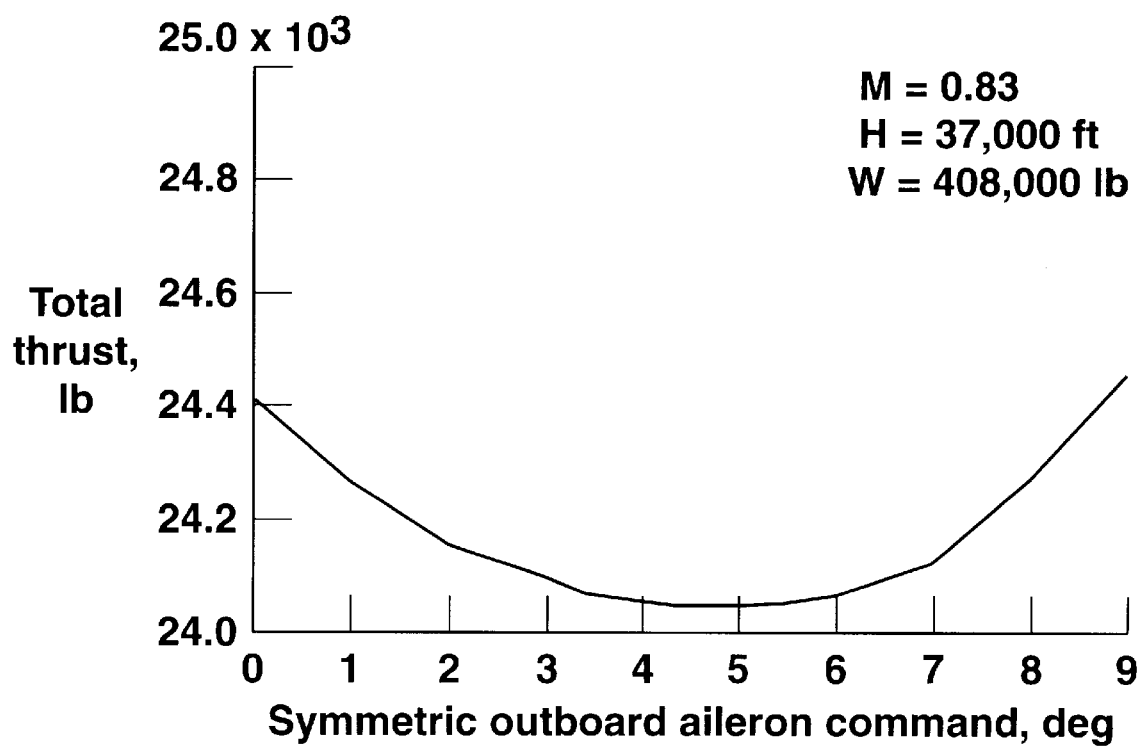
FIG. 3 is a graph of variation of thrust required for trimmed flight as a function of symmetric aileron displacement and shows a thrust of 24.03×10 $^3$ lb, an improvement of 364 lb (1.5%) at approximately 4.5° symmetric aileron deflections.

In any case, the excitation form for the maximum amplitude, A, of the forced response must be selected to cover the point of optimality, i.e., minimum drag which translates into minimum thrust required as a function of symmetric outboard ailerons at $\delta_{iopt}$ shown in FIG. 3 as equal to 4 to 5° for the example under discussion of optimizing cruise at 37,000 ft. That maximum excitation amplitude needed may be determined empirically.

If there are multiple redundant control effectors, each must cycle through an excitation forced response maneuver. Analytically, the best means of determining the optimal for more than one redundant control effector (n>1) is to provide simultaneous excitation of the n redundant control effectors, as noted hereinbefore. However, the excitation of each of the redundant control effectors must be independent (i.e. different) in some way to insure identifiability of the separate control effectors.

To achieve separability, the excitation signals used for each effector i=1,2 . . . n may have a different form such as one having a sine wave form and the other a square wave form. However, as already noted, a raised-cosine form is well suited given the passenger comfort constraints. Consequently, to have independence and still use a raised-cosine excitation form, the excitation signal for each redundant control effector may be applied with different periods. This technique can allow two or more redundant control effectors to be excited in order to provide for sets of data to be gathered from all effectors for a joint optimal solution with only one APO algorithm sequence.

For multiple redundant surfaces, sequential optimization could also be used to avoid an identification problem by performing the excitation and optimization of one control effector first, then set that control effector to its optimal position and repeat the procedure for each additional redundant control effector. Because this will not provide a "joint optimal" solution, iteration of this multiple-effectors procedure should continue for all redundant effectors until convergence is achieved. The results would then not be achieved in what may be considered real time, but near enough to real time to be good APO control.

SECOND

Data is collected during the excitation of forced response maneuver of each one or more redundant control effectors at a nominal rate, for example one set of response data per second, such that for a raised-cosine excitation of, for example, 300 sec., about 300 separate sets of data can be acquired, although data acquisition of ten sets per second would be preferable for assurance of better optimization.

THIRD

For analysis of the sets of response data, the thrust estimation is first made for use in equations (1) and (2) above in the STATEMENT OF THE INVENTION to calculate the values of the lift and drag coefficients in those equations for each set of data. These sets of data are then used to form 300 drag coefficient expansion equations using equation (3), which are then solved for the 5+2(n) unknowns in equation (3) (where n=the number of redundant control effectors), namely $$C_{Do},\ K_o,\ C_{LminC_D}C_{D_M}\ +C_{D_{Hp}},\ K_i\text{'s and }\delta_{iopt}\text{'s}.$$

Solutions can be obtained by regression analysis or other comparable techniques.

FOURTH

Apply the optimal solution (s) to the control effector(s) in a smooth fashion. Use of the first-half of a raised-cosine form to reach the optimal value is satisfactory.

Repeat the optimization algorithm either continuously at fixed flight time intervals or only as needed, i.e., when need is determined by changes in flight conditions specified as criteria.

Figure 4:
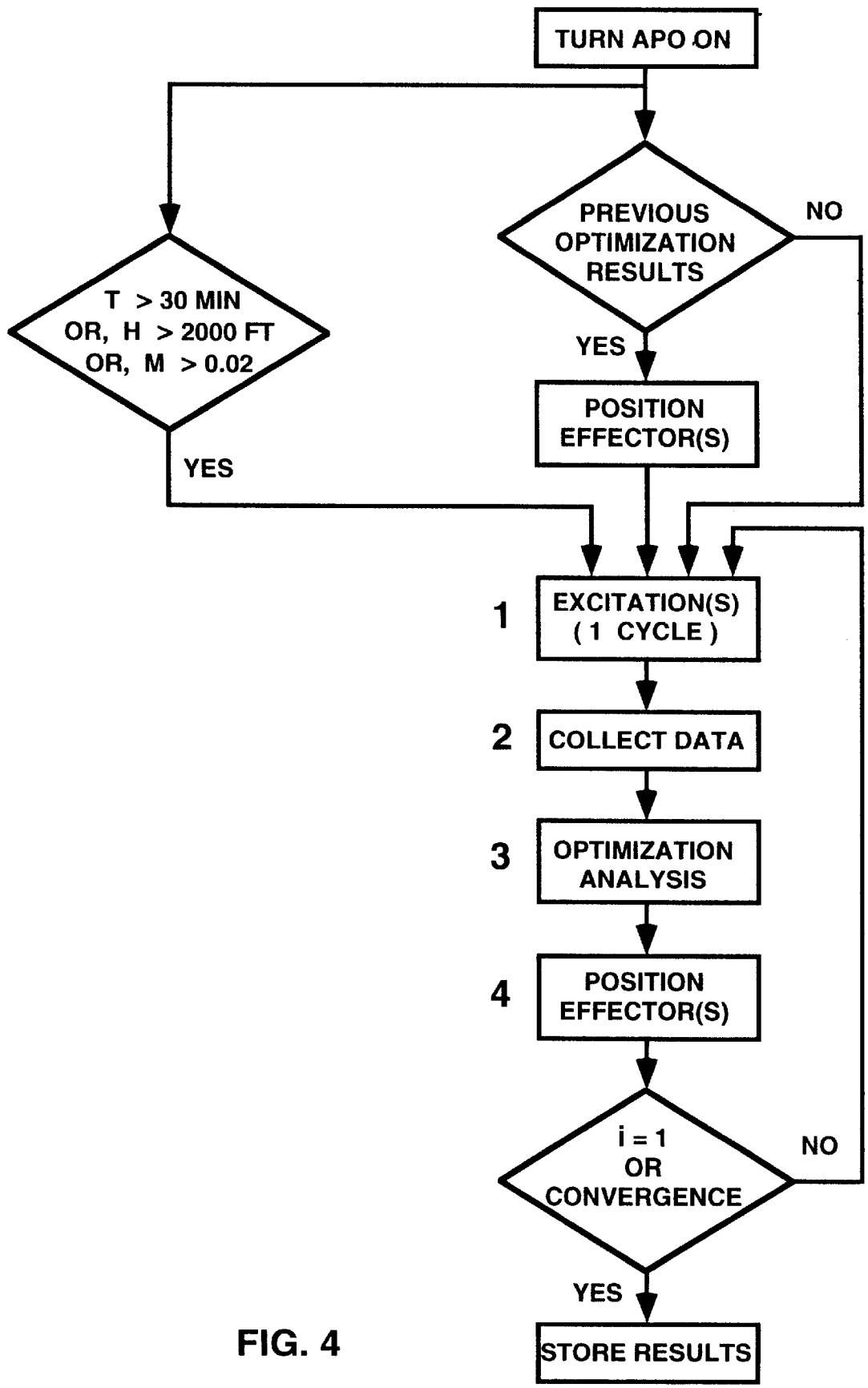
FIG. 4 is a flow chart on an operational implementation of the APO algorithm.

The flow chart of FIG. 4 illustrates the sequence of operations for the APO algorithm which recurs under control of the programmed APO with elapsed time $\Delta T$ or change in either altitude $\Delta H$ or Mach number $\Delta M$. The algorithm comprises four steps described above and represented by blocks 1 through 4 in the flow chart. Once the optimal $\delta_{iopt}$ is identified and the redundant control effector is positioned accordingly, the aircraft can then take advantage of the optimal (minimum drag) configuration with any number of objectives such as but not limited to:

Minimize Fuel Flow: Trim the aircraft at the same Mach and altitude the APO algorithm determined $\delta_{iopt}$; this will result in minimum fuel flow.

Maximize Mach Number: Trim the aircraft at the same altitude the APO algorithm determined $\delta_{iopt}$ and at the steady-state fuel flow recorded just prior to the APO algorithm being requested to determine $\delta_{iopt}$; this will result in maximum Mach number.

Maximize Altitude: Trim the aircraft at the same Mach number the APO algorithm determined $\delta_{iopt}$ and at the steady-state fuel flow recorded just prior to the APO algorithm being requested to determine $\delta_{iopt}$; this will result in maximum altitude.

Maximum Loiter Time at a Fixed Altitude: Trim the aircraft at the same flight condition the APO algorithm determined $\delta_{iopt}$; this will result in reduced fuel flow at that flight condition. Trim the aircraft to a fixed increment lower Mach number (e.g., $\Delta M-0.02$) by reducing throttle position (fuel flow). Since this is a new flight condition, request the recurrence of the APO algorithm to determine a new $\delta_{iopt}$ which may be imperceptibly small since the flight condition change was relatively small. Repeat these two procedures (reduce Mach number and request the recurrence of the APO algorithm for a new $\delta_{iopt}$) until fuel flow begins to increase, thus locating a $\delta_{iopt}$ for a minimum Mach number. There will be that minimum since as Mach is reduced and the angle-of-attack increases to maintain lift (in order to maintain altitude), a point is reached where drag to angle-of-attack is going to be dominant.

Once the optimal $\delta_{iopt}$ is identified and the redundant control effector is moved to the optimal position (minimum drag), the APO algorithm (program) can be placed in an idle mode until either automatic or crew monitoring of elapsed time or change in altitude or Mach number requests a recurrence of the APO algorithm.

On an operational flight mission, the APO is turned on by the flight crew during any steady-state segment of the mission. In any instance of turning on the APO algorithm, the program of the algorithm will first check on whether there are any previous optimization results stored. If not, as in the case of the APO algorithm being turned on for the first time for this particular segment of the mission (e.g., climb, cruise, descent or other), the algorithm proceeds to the first phase. If the check is positive (YES), the previously stored optimal results of the redundant control effector(s) will be used as a priori values. This procedure of storing previously determined optimal redundant control effector values and using the stored values as a starting point when the APO algorithm is turned on again will maximize benefits of the APO algorithm by utilizing representative optimal values to arrive at new optimal values more quickly than starting without any a priori values.

There is a separate 4-dimensional table for each redundant control effector(s) value of Mach, altitude, gross weight and center of gravity, e.g., as follows:

| DATA TABLE | Mach | Altitude | Gross. Wt. | C.g. |
|---|---|---|---|---|
| min delta | 0.02 | 2,000 | 10,000 | 0.5 |
| max interp. | 0.10 | 10,000 | 50,000 | 2.5 |

Data is stored to the nearest min delta. The maximum interpolation allowed to determine an a prioi position is max interp. The values in the above table are only representative; actualvalues depend on the aircraft in question.
Note: The redundant control effector(s) can include but is not limited to designated effectors of the aircraft such as symmetric ailerons, flaps, slats, spoilers, horizontal stabilator, elevator, thrust, center of gravity, variable inlet and/or engine geometry (for propulsion systems with that capability), and thrust vectoring for longitudinal effectors and rudder, ailerons, (normal or differential) and differential thrust for lateral and directional effectors.

Although the above process may infer a post-maneuver analysis, the analysis can be performed in real time with the data acquired to that point in time. In certain applications this may provide some benefits. This analysis processing then continues for the last part of the raised-cosine excitation during which the maneuver is completed and then the entire process is repeated until a criteria has been met to assure that optimal conditions have been reached (e.g. the criteria that the estimated $\delta_{iopt}$ remains constant over two or more passes through the process).

It would be well to note at this point that the raised-cosine excitation form need not begin to immediately diminish in amplitude once the maximum amplitude is reached. Instead the form may be flat at maximum amplitude for say 200 sec. to extend the period of a 300 sec. raised-cosine excitation to 500 sec. This has the benefit of smoothing the maneuver more and allowing more time for the analysis of data gathered during the first part of increasing amplitude since new sets of data during the flat part need not be processed at the times that there is not some significant change from the last point of significant change. This is a particularly useful benefit as the number n of redundant effectors increases beyond a few.

For normal transport operation in cruise flight, continuous optimization is not necessary and in fact would tend to increase drag since ideally, once you are at the optimal control position of a redundant effector, all other maneuvers would be away from that optimal position and therefore increase drag. Thus, the optimization algorithm should be performed only when either a certain change in flight condition criteria is met or a certain time interval has elapsed. For both of these, subjective but reasonable criteria would be the following incremental changes: a) ΔMach= 0.02; b) Δaltitude=2000 ft.; and Δtime=30 min.

Algorithm solutions can range from continuous to batch operation. In either case, all unknown coefficients of equation (3) are identified including the optimal aileron position, $\delta_{iopt}$.

Values of $K_o$ and $C_{LminC_D}$ are assumed to be independent of the symmetric aileron position for small deflections. In actuality, symmetric aileron deflection would result in a small change to spanwise lift distribution and, in turn, to induced drag characteristics of the wing. This effect would cause a small variation in the value of $K_o$ as a function of symmetric aileron position. Sensitivity of the APO algorithm to this variation has been left for future studies.

The formulation of equation (3) is not unique; the important element being that the first-order effects of aileron-induced drag be represented in the $C_D$ equation in a plausible manner. Care should be taken not to over parameterize the problem; independence of the various estimates must be maintained to provide meaningful results. The actual drag reduction is $$\Delta \text{Drag} = qSK_i(\Delta\delta_i)^2 \qquad (5)$$

Other performance related calculations, such as specific fuel consumption and range, can be calculated postflight.
Control Effectors A wide range of controls or variables can potentially play a role in performance optimization for current and future generation aircraft. These controls and variables include elevator, horizontal stabilizer, outboard aileron, inboard aileron, flaps, slats, rudder, c.g., thrust modulation, thrust vectoring, and differential thrust (FIG. 1a) In addition, the potential for flightpath control using only differential thrust has been demonstrated. Spoilers are probably not an option for performance optimization because they only increase drag. Although if a case exists which requires drag modulation, spoilers are a viable controller.

Note that delta-wing aircraft configurations generally have less optimization potential than tail-configured aircraft because delta wings have fewer independent control effectors. Fewer effectors reduce the potential for optimization. The main difference is that there is no independent horizontal stabilizer-elevator for delta-wing configurations, thus removing a major potential for wing optimization. These differences do not imply that more sophisticated wing leading- and trailing-edge (TE) devices, which would permit some degree of camber optimization, could not be implemented. A canard can significantly increase the optimization potential for conventional and delta-wing configurations.
Instrumentation Successfully implementing a performance optimization algorithm requires high-quality, sensitive instrumentation. Fortunately, the instrumentation being implemented in today's most advanced transports for FMS operation (trajectory and navigation control) is very good. Although a large number of cost functions or variables exists that could conceivably be used for optimization, only a few basic aircraft measurements are required for cruise drag minimization. To minimize fuel flow at constant Mach number and altitude conditions requires accurate fuel-flow indications, such as either fuel flow, fuel valve position, throttle position, or thrust.

In-lieu of direct fuel-flow measurements, engine pressure ratio (EPR) measurements combined with a representative engine model, which is a function of flight condition, will provide accurate incremental fuel-flow or thrust results. Although in absolute terms the accuracy required would be demanding, the optimization problem only places demands on perturbation accuracy, which is not affected by biases. Maximizing velocity for constant altitude and fuel flow requires accurate perturbation measurements of velocity, flightpath acceleration, or both.

Real-Time Drag Minimization

Preferably, performance optimization could be accomplished using responses to pilot or autopilot and FMS commands. However, with tight pitch-rate, pitch-attitude, and altitude- and Mach-hold control laws, external environment-based disturbances and associated responses would, generally, be small. As a result, forced response of redundant controls by unique excitation is required to ensure identifiability. The requirement for forced excitation must be tempered by the additional requirement that neither handling nor ride qualities are noticeably impacted. In turn, this requirement dictates the range of excitation periods and amplitudes.

Aircraft Simulation Model

The APO algorithm was evaluated using a simulation of a first-generation wide-body transport. The simulation is high fidelity and covers the full aircraft envelope. The primary control system has simple rate feedback, while the altitude- and Mach-hold autopilot modes were designed with feedback to the stabilator and throttle, respectively. The aileron drag characteristics were modified (based on simulation and flight data of similar configurations) to provide a quadratic drag variation with symmetric aileron displacement. All the simulation runs were initiated at Mach 0.83, at an altitude of 37,000 ft, and at a weight of 408,000 lb. Fuel burn was simulated as a function of thrust. Low-order thrust versus throttle-lever dynamics are in the simulation. Light turbulence was used for all runs to provide a realistic signal-to-noise ratio. FIG. 3 shows the variation of thrust required for trimmed steady-state flight as a function of symmetric aileron displacement. The maximum drag reduction of 364 lb (1.5 percent) occurs at approximately 4.5° symmetric aileron deflection.

Results and Discussion

Figure 5:
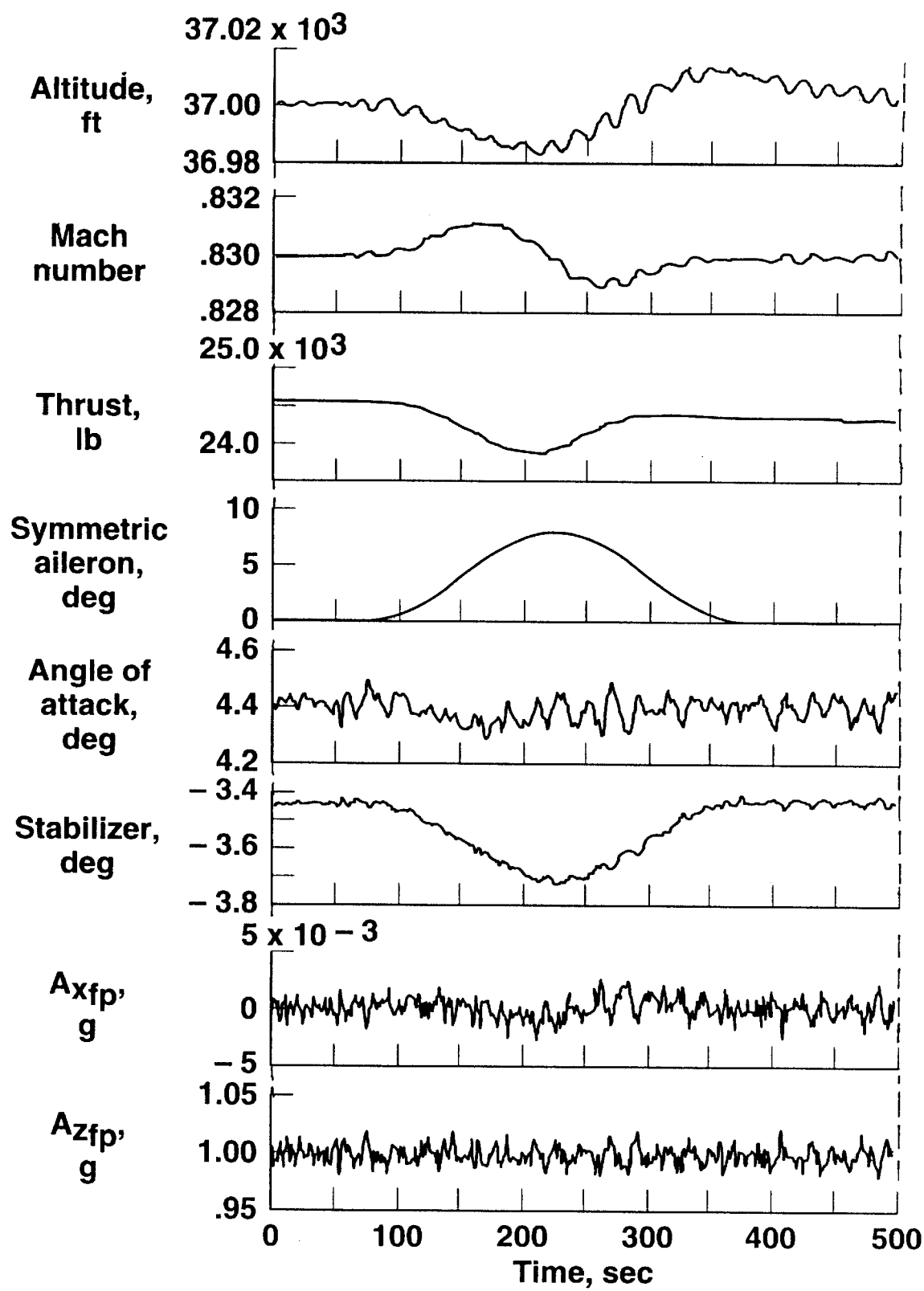
FIG. 5 presents a time history of forced excitation response cycle with both altitude- and velocity-hold turns on during drag minimization maneuver using symmetric ailerons as the sole redundant effector.
Figure 6:
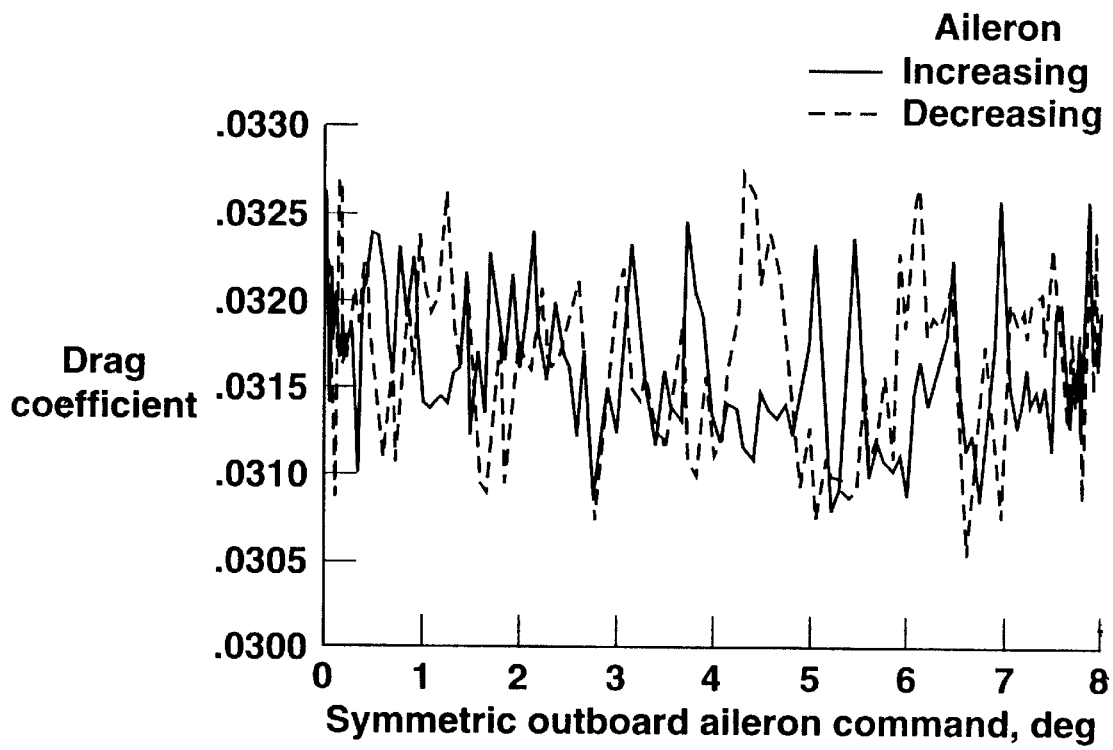
FIG. 6 presents variation of calculated drag coefficient (with no corrections) as a function of symmetric outboard aileron which does not present a clear picture of the minimum drag point.

FIG. 5 presents the forced excitation response, with altitude- and Mach-hold modes on, to a raised cosine (1.0–cos ($\omega t$)) symmetric aileron command with a 300-sec duration. (The $\omega$ is the angular frequency.) The simulated responses used in the analysis are flightpath axes accelerations, angle of attack, thrust, weight, and symmetric aileron deflection. For this analysis, it was assumed that the angle of attack is calculated from pitch attitude INS velocities and true airspeed. In addition, the flightpath accelerations are calculated from body-axes accelerations rotated through angle of attack, and thrust is obtained as a function of EPR and flight condition. The variation of $C_D$ with $\delta_i$ does not present a clear picture of the minimum drag point (FIG. 6).

Figure 7:
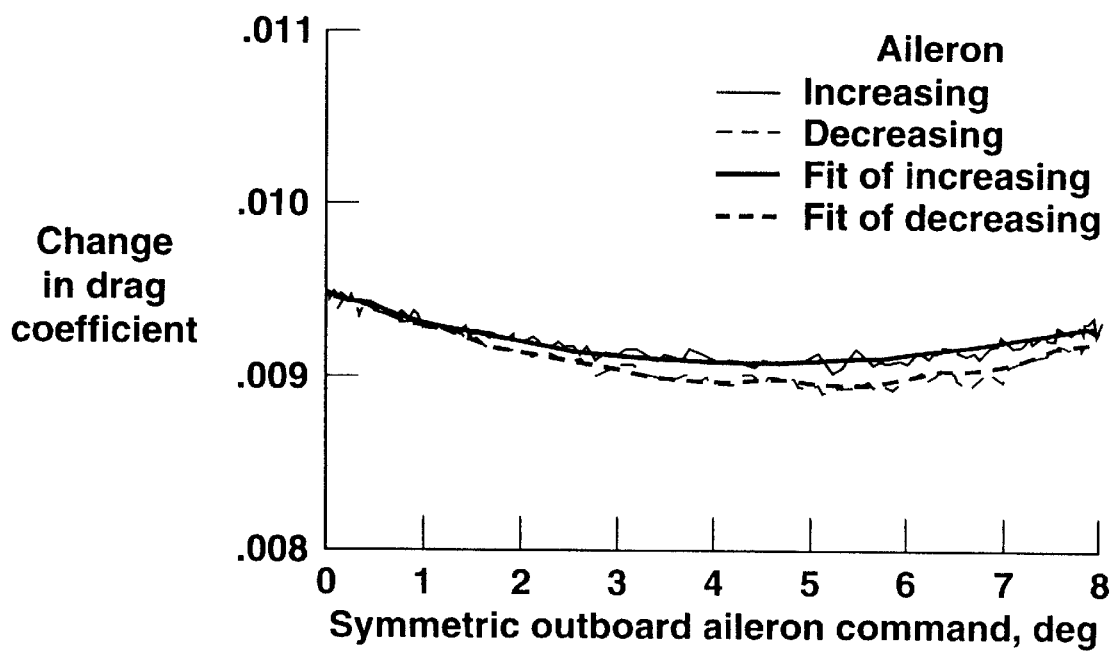
FIG. 7 presents change in drag coefficient (corrected for $C_L$ changes) as a function of symmetric outboard aileron command, deg.

FIG. 7 presents $\Delta C_D = C_D - K_o \{C_L - C_{LminC_D}\}^2$ with $\delta_i$ being the sole symmetric aileron, the sole redundant control effector. Correcting for the $C_L$ variations produces a much clearer picture of the drag minimization process. The quadratic variation of $\Delta C_D$ is clear, but there still is a significant difference between increasing and decreasing $\delta_i$ commands. (Note that the $C_D$ and $\Delta C_D$ incremental scales are the same for FIGS. 6–9 for ease of comparison.)

Figure 8:
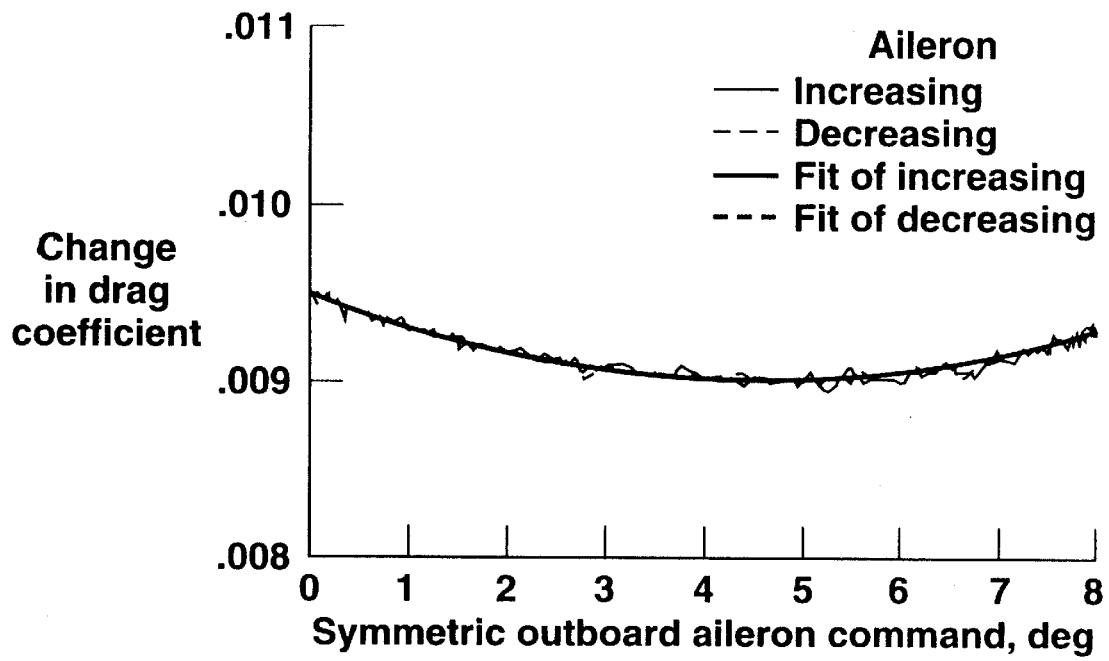
FIG. 8 presents change in drag coefficient (corrected for $C_L$ and Mach number changes) as a function of symmetric outboard aileron command, deg.
Figure 9:
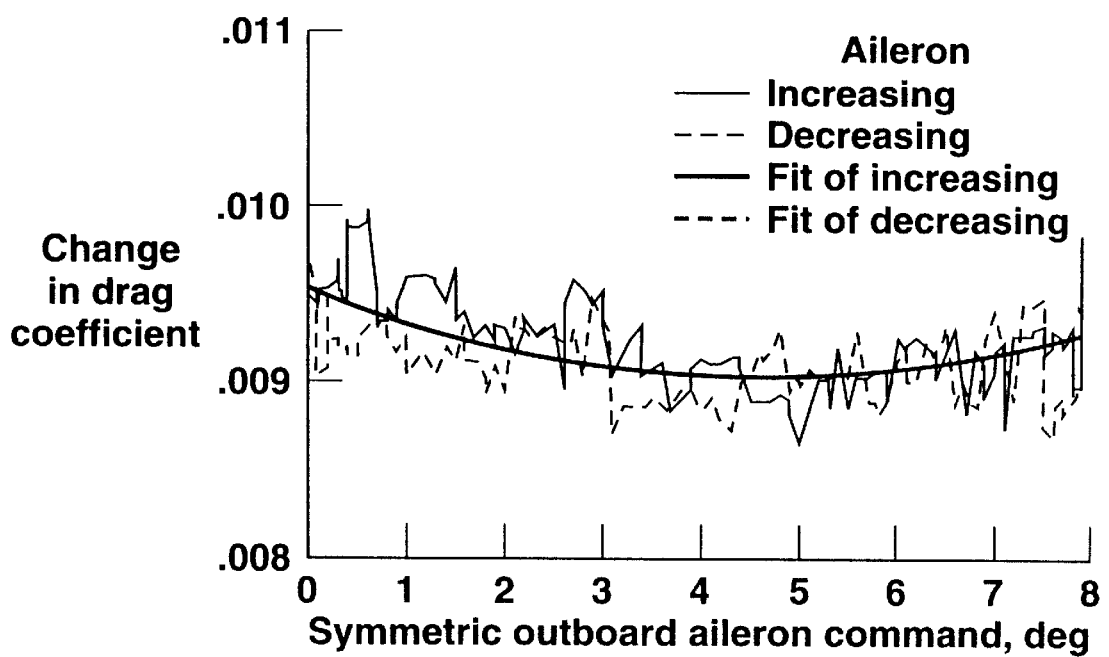
FIG. 9 presents change in drag coefficient (corrected for $C_L$ and Mach number changes) as a function of symmetric outboard aileron command, deg (with resolution on parameters used in the analysis).

A close look at the time histories reveals that Mach number variations exist which could, in turn, contribute a change in drag as a function of Mach number via a $C_{D_M}$ effect. To improve the accuracy of the analysis, a linear $C_{D_M}\Delta M$ term was added to Equation 3 with $C_{D_M}$ added to the list of variables to be estimated. FIG. 8 presents the $\Delta C_D$ variation (including the Mach number effect correction) with $\delta_i = \delta_a$ (for symmetric aileron) and the quadratic variation is now well-defined and agrees with the minimum drag point of FIG. 4.

The variation of drag with the $\delta_{iopt}$ variation can be modeled as a quadratic function for the purposes of locating the local minimum of even a potentially complex function. It is not required that the true drag associated with the $\delta_{iopt}$ variation be quadratic but only that a quadratic representation of the local minima be reasonably representative of the true minima. This modeling will assure that the local minima is found.

Sensitivity to Baseline Data

The good results presented in FIG. 8 may not be all that surprising in view of the fact that the simulation output variables are perfect with, at most, some white noise effects manifested from the turbulence. Assurance of analysis insensitivity to all known effects must be verified.

To minimize the variation or inaccuracy of the estimates, or both, a priori values of $K_o$ and $C_{LminC_D}$ are used. These parameters characterize the quadratic nature of the $C_L/C_D$ variation. Separate parametric variations of these a priori parameters of ±25 percent and ±50 percent on $K_o$ and $C_{LminC_D}$ respectively were performed. These variations produced less than 0.1° variation on the optimal symmetric aileron value (4.5°). As a result, the optimal solution appears insensitive to these a priori parameters.

Measurement Bias Effects

For absolute performance analysis, measurement bias is a limiting factor on analysis accuracy. However, the formulation of this APO analysis algorithm is designed to be insensitive to measurement bias. The following biases (applied one at a time) produced less than 0.1° variation on the optimal symmetric aileron value:

| Parameter | Bias |
| --- | --- |
| Angle of Attack | 0.5° |
| Acceleration along the flightpath | 0.02 g |
| Acceleration (upward) normal to the flightpath | 0.02 g |
| Net aircraft thrust | 1500 lb |
| Aircraft gross weight | 10,000 lb |

A bias on the symmetric aileron measurement produces an equivalent change on the optimal solution, but in true terms, the solution is unaffected. Bias insensitivity is significant relative to the analysis because measurement biases are common. Note also that these findings apply in spite of the fact that the equations are nonlinear.

Resolution Effects

Operating near or at the resolution limits of instrumentation is potentially a serious problem, and the analysis procedure must be insensitive to these quantization effects. Formulation of this APO analysis algorithm is not overly sensitive to resolution resulting, in part, from the regression technique employed. The results of FIG. 8 are repeated in FIG. 9 but with the following resolution set:

| Parameter | Bias |
| --- | --- |
| Aileron position | 0.10 |
| Angle of Attack | 0.10 |
| Acceleration along the flightpath | 0.002 g |
| Acceleration (upward) normal to the flightpath | 0.002 g |
| Net aircraft thrust | 150 lb |
| Mach number | 0.001 lb |

The analysis with resolution produced less than 0.2° variation from the optimal symmetric aileron value case of FIG. 8.

The algorithm appears to be most sensitive to thrust resolution. An increase in the thrust resolution to 300 lb changes the optimal symmetric aileron value by 0.4°. In general, however, the optimal solution is relatively insensitive to these resolution effects.

Thrust Accuracy

Figure 10:
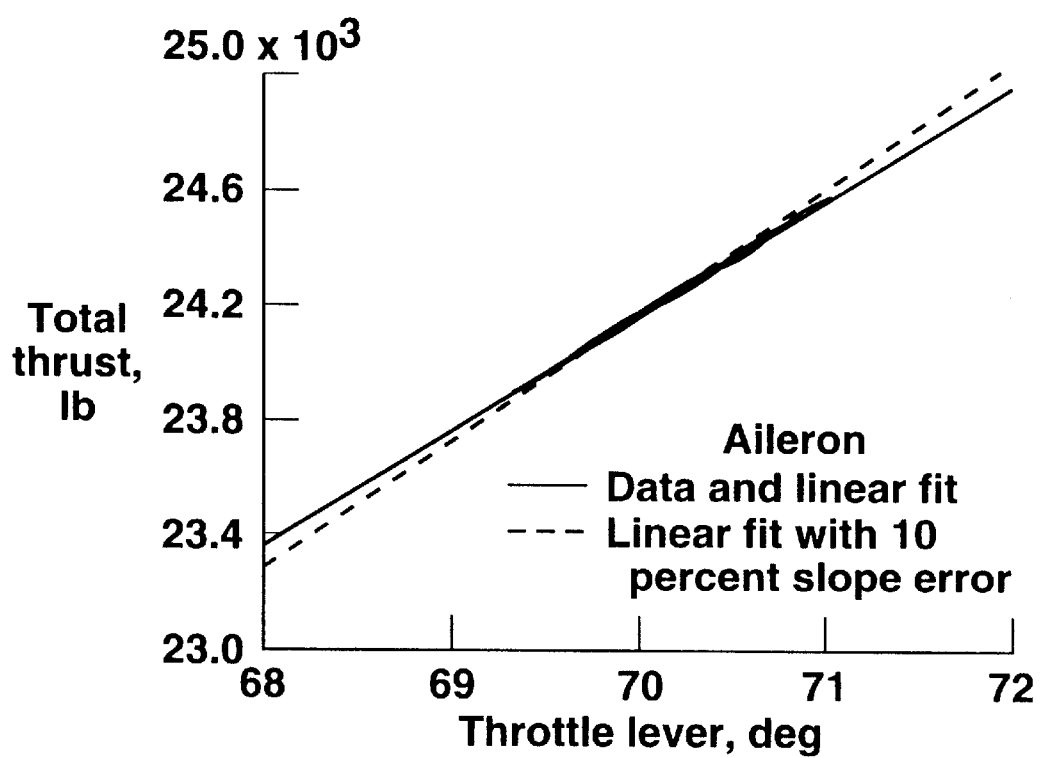
FIG. 10 presents variation of total thrust with throttle lever for the data of the time history of FIG. 5.

Although thrust is not measured, it is determined based on EPR and flight condition measurements and a representative engine model. The thrust calculations will tend to be the least accurate of all inputs to the analysis process. Constant errors in the thrust level are not a problem. However, thrust is based on interpolation of steady-state thrust tables; hence, inaccuracies caused by lack of modeled engine dynamics, whether they accrue from throttle lever motion or atmospheric effects, will occur. A cursory evaluation of this effect was conducted by calculating a thrust value to be fed into the analysis as a linear variation with throttle lever. FIG. 10 shows the variation of thrust with throttle lever for the data of FIG. 5 along with a linear fit of the data. Using this relationship in the analysis produced an error of less than 0.1° in the optimal symmetric aileron solution.

Minimizing fuel flow at constant Mach number and altitude conditions requires accurate fuel-flow indications, such as fuel flow, fuel valve position, throttle position, or thrust. In-lieu of direct fuel-flow measurements, EPR measurements combined with a representative engine model, which is a function of flight condition, will provide sufficiently accurate incremental fuel-flow or thrust estimates.

A more realistic and interesting situation is the sensitivity of the solution to an error in the slope of the thrust as a function of the throttle of the linear fit (FIG. 10). A bias of the linear relationship is addressed above under the Measurement Bias Effects heading. An error in the slope (in addition to a bias error) would be representative of a miss-modeling of the engine characteristics via a table look-up process. FIG. 10 also shows a linear thrust-throttle lever variation with a 10-percent increase in slope and with the constant adjusted so that the linear relationship has the correct thrust level at the trim flight condition. The constant has the same effect as a bias error and, therefore, is a reasonable assumption. The 10-percent error in slope produced a negligible (less than 0.1°) difference in the optimal aileron solution. A 20-percent error produces a 0.4° difference in the optimal aileron solution. In referring back to FIG. 5, even a 0.5° error in the optimal solution is insignificant because the variation of drag with aileron is shallow.

Hardware Implementation

Selected aircraft have the hardware (symmetric aileron trim deflection capability) required to perform onboard performance optimization and, therefore, would only require a relatively simple set of optimization software. Algorithm redundancy is not required because the algorithm is a nonsafety-of-flight system. This nonsafety-of-flight aspect can be assured by having APO in a discretionary mode with very limited rate and position authority. The algorithm can be a completely independent set of code and, therefore, avoid the issues of integration with the FMS. The algorithm can be thought of as a slow, limited authority trimmer.

For aircraft that do not currently have the hardware capability of moving the outboard ailerons symmetrically, a relatively simple modification consisting of adding a low frequency, limited authority, trim actuator in series with the mechanical command to the outboard aileron actuator would suffice. The slow actuator rate plus limited authority minimizes safety-related issues.

Related Issues

The forced excitation requirement of real-time adaptive optimization generally attracts concern and, therefore, some discussion is in order. For the very steady conditions of cruise flight optimization, forced response excitation is the only means of performing identification and adaptive optimization. No other means of identifying the desired characteristics of the aircraft exist. The low frequency raised cosine excitation was intended to minimize interaction with the autopilot inner-loops and to minimize the effect on ride qualities. This function results in a negligible incremental normal acceleration ($\approx$0.001 g) and precludes concern for other aircraft wear and tear, such as control surfaces and engines. Although minimal interactions between the explicit excitation and the inner loop autopilot modes were observed, other aircraft, control surface combinations, or both, could produce degraded inner-loop performance. In such instances, inner-loop controller lead as a function of the explicit excitation function could be used to minimize inner-loop performance degradation.

Because aircraft specific variations play a significant role in the actual amount of performance improvement accruable, using previous optimality results as initial conditions can speed up optimality convergence for subsequent flights.

Different flight conditions have also been evaluated, and it appears that very little, if any, algorithm tuning is required. Exploratory algorithms have also been evaluated for optimization in the climb-to-altitude flight segment.

Concluding Remarks

This invention described presents a real-time, adaptive-optimal performance algorithm for application to subsonic transports. Preliminary simulation results indicate the approach is very promising. The algorithm implementation is simple and appears to have robust performance characteristics.

Because the performance optimization problem is searching for small benefits, instrumentation may appear to be a critical factor. However, realistic instrumentation and measurement effects have been evaluated, demonstrating that the algorithm is insensitive to these effects.

While a simulation model demonstrates that the algorithm looks promising, real world effects cannot be predicted or simulated accurately. Nevertheless, it can be predicted and simulated that application of APO to any fly-by-wire aircraft which already has electronic control over desired redundant control effectors, requires only software additions which would logically be placed in the FMS, and that the pilot would interface the APO software through the Control and Display Unit (CDU) located in the cockpit. To that extent a simulation model demonstrates that APO is applicable to any fly-by-wire aircraft. Aircraft which do not have electronic control over the redundant control effectors, need only to be modified by installation of electrically commanded actuators (or equivalent) somewhere within the system controlling the particular redundant control effectors of interest. Of course, this would also require the software modifications in the FMS discussed above for fly-by-wire aircraft. A flight evaluation of the adaptive performance optimization algorithm is underway to research the issues of operational use; benefits can only be determined in-flight. However, it can now be stated that the application to supersonic transports will have a significantly greater benefit than for subsonic transports, because the supersonic transport must cover a much larger envelope, has a variable geometry propulsion system, and thus provides more opportunities for optimization.

Although particular embodiments of the invention have been described and illustrated herein, it is recognized that modifications may readily occur to those skilled in the art. Consequently, it is intended that the claims be interpreted to cover such modifications and equivalents thereof.

What is claimed is:

1. A method for providing in-flight adaptive performance optimization of an aircraft in a steady climb, cruise, turn or descent flight condition that uses autopilot and navigation modes in a normal manner or by the pilot's direct control, where said optimization is based on real-time measurements and calculations of incremental drag from a forced response maneuver of one or more redundant control effectors that affect aircraft drag defined as those control effectors that are in excess of the minimum set of control effectors that affect aircraft drag required to maintain said steady flight condition in progress, comprising the steps of first applying excitation to said one or more redundant control effectors simultaneously in a smooth raised-cosine form over a finite interval, concurrently gathering sets of measurements made during said excitation, next calculating lift and drag coefficients $C_L$ and $C_D$ from two equations, one for each coefficient, and then calculating an optimum position $\delta_{iopt}$ of said one or more redundant control effectors from a third equation which is an expansion of $C_D$ as a function of parasitic drag, induced drag, Mach, altitude drag effects, and control effector drag, said third equation comprising a quadratic variation of drag with positions $\delta_i$ of redundant control effectors i=1 to n, solving said third equation for $\delta_{iopt}$ in a separate step, and finally using the value $\delta_{iopt}$ to set the position of each control effector i for optimum performance of said aircraft throughout the remainder of said steady flight condition, unless monitored flight conditions change by some predetermined minimum amount, or a predetermined minimum flight time lapses, or flight conditions have changed an amount perceptible by a flight crew monitoring instruments in the cockpit of said aircraft, in response to any one of which occurs, said method for providing in-flight adaptive performance optimization is repeated.

2. A method as defined in claim 1 for providing in-flight adaptive performance optimization of an aircraft after said steady flight condition has been reached wherein, while applying forced response excitation to said one or more redundant control effectors simultaneously, collecting sets of data during the forced response excitation, performing optimization analysis to determine lift and drag coefficients $C_L$ and $C_D$ for each set of data by solving the following equations:

$$C_L = \text{Lift}/(qS) = \{WA_{zf_p} - \Sigma T_i \sin(\alpha-\eta)\}/(qS)$$

$$C_D = \text{Drag}/(qS) = \{\Sigma T_i \cos(\alpha-\eta) - WA_{xf_p}\}/(qS)$$

where: q=dynamic pressure, lb/ft$^2$,
S=wing reference area, ft$^2$,
A=angle of attack, radians,
W=aircraft gross weight, lbs, at the start of said method
$A_{zf_p}$=acceleration normal to flight path, (positive upward),
$A_{xf_p}$=aircraft acceleration along the flight path (positive forward),
$\eta$=inclination of engine thrust relative to aircraft fuselage, radians,
$\Sigma$=summation of the bracketed quantity over the number of engines of the aircraft from i=1 to N, solving for estimates of $\delta_{iopt}$ for each redundant control effector i by calculating unknown variables $$C_{Do}, K_o, C_{LminC_D} C_{D_M} + C_{D_{H_p}}, K_i\text{'s}$$

in the following equation:

$$C_D = C_{Do} + K_o\{C_L - C_{LminC_D}\}^2 + C_{D_M}\Delta M + C_{D_{H_p}}\Delta H_p + \Sigma K_i(\delta_i - \delta_{iopt})^2$$

where $C_{do}$=minimum drag coefficient,
$C_{LminC_D}$=$C_L$ at minimum $C_D$,
$C_{D_M}$=coefficient of drag caused by Mach number, $C_{D_{H_p}}$ = coefficient of drag caused by altitude, $\Delta M$=change in Mach number from the time of turning the APO on,
$\Delta H_P$=change in altitude from the time of turning the APO on,
$K_o$ and $K_i$ are drag equation coefficients,
$\delta_i$=position of redundant control effector i,
$\delta_{iopt}$=optimal position of redundant control effector i,
$\Sigma$=summation over a number n of redundant control effectors from i=1 to n and finally solving for $\delta_{iopt}$.

3. A method as defined in claim 2 wherein the equation for $C_D$ is a quadratic variation of $C_D$ with $\delta_i$.

4. A method as defined in claim 2 wherein said one or more redundant control effectors of said aircraft comprise symmetric ailerons, flaps, slats, spoilers, stabilizer, elevator, thrust, center-of-gravity and thrust vectoring, all for longitudinal effectors, and rudder, normal or differential ailerons and differential thrust, all for lateral or directional effectors.

5. A method as defined in claim 2, wherein to reduce the number of unknowns, a priori values of $K_o$ and $C_{LminC_D}$ are utilized to solve for optimal $\delta_{iopt}$ estimates defined by the equation for $C_D$ from which, at the end of the analysis of all sets of data the most optimal estimate $\delta_{iopt}$ is determined for the position of redundant control effector i until said method is repeated for an update of the setting of redundant effector positions to maintain optimal adaptive performance operation of the aircraft.

6. A method for providing in-flight adaptive performance optimization of an aircraft as defined in claim 1 wherein the number of redundant control effectors is equal to 1, said method comprising using a forced response maneuver of said redundant control effector to collect aircraft response data to forced maneuvers of limited extent to search for the optimal redundant control effector position, $\delta_{iopt}$ that minimizes drag by solving the following lift and drag equations:

$$C_L = \text{Lift}/(qS) = \{WA_{zf_p} - \Sigma T_i \sin(\alpha-\eta)\}/(qS)$$

$$C_D = \text{Drag}/(qS) = \{\Sigma T_i \cos(\alpha-\eta) - (W)A_{xf_p}\}/(qS)$$

where: q=dynamic pressure, lb/ft$^2$,
S=wing reference area, ft$^2$,
A=angle of attack, radians,
W=aircraft gross weight, lbs, at the start of said method
$A_{zf_p}$=acceleration normal to flight path, (positive upward),
$A_{xf_p}$=aircraft acceleration along the flight path (positive forward), $\eta$=inclination of engine thrust relative to aircraft fuselage, radians, $\Sigma$=summation of the bracketed quantity over the number of engines of the aircraft from i=1 to N, solving for an estimate of $\delta_{i_{opt}}$ for a redundant control effector by calculating the other unknown variables $$C_{Do}, K_o, C_{LminC_D} C_{D_M} + C_{D_{H_p}}, K_1$$

in the following equation:

$$C_D = C_{Do} + K_o \{C_L - C_{LminC_D}\}^2 + C_{D_M} \Delta M + C_{D_{H_p}} \Delta H_p + K_1(\delta_1 - \delta_{1opt})^2$$

where $C_{Do}$=minimum drag coefficient, $C_{LminC_D} = C_L$ at minimum $C_D$, $C_{D_M}$=coefficient of drag caused by Mach number, $C_{D_{H_p}}$ = coefficient of drag caused by altitude, $\Delta M$=change in Mach number from the time of turning the APO on, $\Delta H_p$=change in altitude from the time of turning the APO on, $K_o$ and $K_1$ are drag equation coefficients, $\delta_1$=position of said redundant control effector, $\delta_{1opt}$=optimal position of said redundant control effector, said aircraft response data collected for analysis using the above equations being acquired at a steady flight condition comprising relatively constant Mach number, altitude and heading accomplished by any combination of autopilot and pilot control.

* * * * *